(12) United States Patent
Hirakida (10) Patent No.: US 10,043,689 B2
(45) Date of Patent: Aug. 7, 2018

(54) CHAMBER APPARATUS AND PROCESSING SYSTEM

(71) Applicant: HIRATA CORPORATION, Shinagawa-ku, Tokyo (JP)

(72) Inventor: Jyunichi Hirakida, Tokyo (JP)

(73) Assignee: HIRATA CORPORATION, Shinagawa-Ku, Tokyo (JP)

( * ) Notice: Subject to any disclaimer, the term of this patent is extended or adjusted under 35 U.S.C. 154(b) by 413 days.

(21) Appl. No.: 14/732,064

(22) Filed: Jun. 5, 2015

(65) Prior Publication Data
US 2016/0358800 A1  Dec. 8, 2016

(51) Int. Cl.
*H01L 21/67*  (2006.01)

(52) U.S. Cl.
CPC .... *H01L 21/67196* (2013.01); *H01L 21/6719* (2013.01); *H01L 21/67126* (2013.01)

(58) Field of Classification Search
CPC ........... H01L 21/67126; H01L 21/6719; H01L 21/67196
See application file for complete search history.

(56) References Cited

U.S. PATENT DOCUMENTS

| | | | | |
|---|---|---|---|---|
| 5,388,945 A * | 2/1995 | Garric | ................. | G03F 7/70541 414/217.1 |
| 5,820,104 A * | 10/1998 | Koyano | ................. | F16K 51/02 251/129.15 |
| 6,203,582 B1 * | 3/2001 | Berner | .............. | H01L 21/67173 29/25.01 |
| 8,261,928 B2 | 9/2012 | Quintel | | |
| 2005/0238464 A1 * | 10/2005 | Matsuoka | ......... | H01L 21/67126 414/217 |
| 2011/0297683 A1 | 12/2011 | Quintel | | |

(Continued)

FOREIGN PATENT DOCUMENTS

| CN | 101174552 A | 5/2008 |
|---|---|---|
| CN | 101615570 A | 12/2009 |

(Continued)

OTHER PUBLICATIONS

Taiwan Office Action dated Oct. 13, 2016 issued in corresponding Taiwan Patent Appln. No. 104118311 (5 pages).

(Continued)

*Primary Examiner* — Saul Rodriguez
*Assistant Examiner* — Ashley K Romano
(74) *Attorney, Agent, or Firm* — Buchanan Ingersoll & Rooney PC (57) ABSTRACT

A chamber apparatus according to the present invention including a chamber main body including an opening portion in an upper surface; a door that opens/closes the opening portion; and a guide mechanism that slides the door with respect to the chamber main body. The door includes a movable member slidably supported by the guide mechanism; a first support provided on the movable member in a fixed manner; a door main body that opens/closes the opening portion; a second support provided on the door main body in a fixed manner; and a floating mechanism that connects the first support and the second support immovably in a horizontal direction and support the second support displaceably in a vertical direction with respect to the first support.

13 Claims, 6 Drawing Sheets

(56) References Cited

U.S. PATENT DOCUMENTS

| | | | |
|---|---|---|---|
| 2012/0064658 A1* | 3/2012 | Rathweg | C23C 14/0629 438/62 |
| 2013/0206058 A1* | 8/2013 | Mauck | H01L 21/6719 118/300 |
| 2014/0027968 A1* | 1/2014 | Krayvitz (Krivts) | B23Q 3/00 269/287 |
| 2015/0321356 A1* | 11/2015 | Vijverberg | H01L 21/6719 414/217 |
| 2015/0361581 A1* | 12/2015 | Carlson | H01L 21/67115 118/641 |
| 2017/0117171 A1* | 4/2017 | Wirth | B25J 5/02 |

FOREIGN PATENT DOCUMENTS

| | | |
|---|---|---|
| JP | S54-083021 U | 6/1979 |
| JP | S55-060761 A | 5/1980 |
| JP | 01269762 A | 10/1989 |
| JP | 2001-008757 A | 1/2001 |
| JP | 2005-253509 A | 9/2005 |
| JP | 2011-024630 A | 2/2011 |
| JP | 2012-087923 A | 5/2012 |
| JP | 2013-533437 A | 8/2013 |
| KR | 10-0656683 B1 | 12/2006 |
| KR | 10-2011-0061497 A | 6/2011 |
| KR | 10-2014-0048793 A | 4/2014 |

OTHER PUBLICATIONS

Notice of Allowance dated Sep. 23, 2016, by the Korean Patent office in corresponding Korean Patent Application No. 10-2015-0082310. (2 pages).

Office Action (Notification of Reasons for Refusal) dated Dec. 22, 2017, by the Japanese Patent Office in corresponding Japanese Patent Application No. 2014-073561 and an English Translation of the Office Action. (6 pages).

\* cited by examiner

CHAMBER APPARATUS AND PROCESSING SYSTEM

BACKGROUND OF THE INVENTION

Field of the Invention

The present invention relates to a chamber apparatus and a processing system.

Description of the Related Art

In a semiconductor manufacturing facility, a work such as a wafer is loaded/unloaded to/from a processing apparatus via a chamber apparatus whose internal space is kept under vacuum. There is proposed a chamber apparatus with a door capable of opening/closing on the top of a chamber main body so as to enable maintenance of the interior. Japanese Patent Laid-Open No. 2012-87923 discloses a chamber apparatus including a single swing door. The door pivots in the vertical direction, thereby opening/closing the chamber apparatus.

As the works become large, the chamber apparatus also tends to be large, and so the door. For the single swing door, a large space to open the door is needed above the chamber apparatus. Depending on the facility environment to place the chamber apparatus, it may be impossible to ensure the sufficient space to open the door above the chamber apparatus. A large door is heavy in weight. Since it may be difficult to make the door pivot by human power, equipment such as a hoisting machine or lifting gear is needed. On the other hand, to maintain airtightness in the chamber apparatus, a mechanism for pressing the door against the chamber main body is also necessary when closing the door.

SUMMARY OF THE INVENTION

It is an object of the present invention to obviate the necessity of a space to open a door above a chamber apparatus and the necessity of auxiliary power to open/close the door and also maintain airtightness in the chamber apparatus when closing the door.

According to an aspect of the present invention, there is provided a chamber apparatus comprising: a chamber main body including an opening portion in an upper surface; a door configured to open/close the opening portion; and a guide mechanism configured to slide the door with respect to the chamber main body, wherein the door comprises: a movable member slidably supported by the guide mechanism; a first support provided on the movable member in a fixed manner; a door main body configured to open/close the opening portion; a second support provided on the door main body in a fixed manner; and a floating mechanism configured to connect the first support and the second support immovably in a horizontal direction and support the second support displaceably in a vertical direction with respect to the first support.

According to another aspect of the present invention, there is provided a processing system comprising: the chamber apparatus; and a processing apparatus for processing a substrate, wherein the processing apparatus comprises: a slot portion arranged on a slide direction side of the door of the chamber apparatus and disposed at a position facing the door in a opened state; and a storage portion communicating with the slot portion and configured to store the door.

Further features of the present invention will become apparent from the following description of exemplary embodiments (with reference to the attached drawings).

DESCRIPTION OF THE EMBODIMENTS

Figure 1:
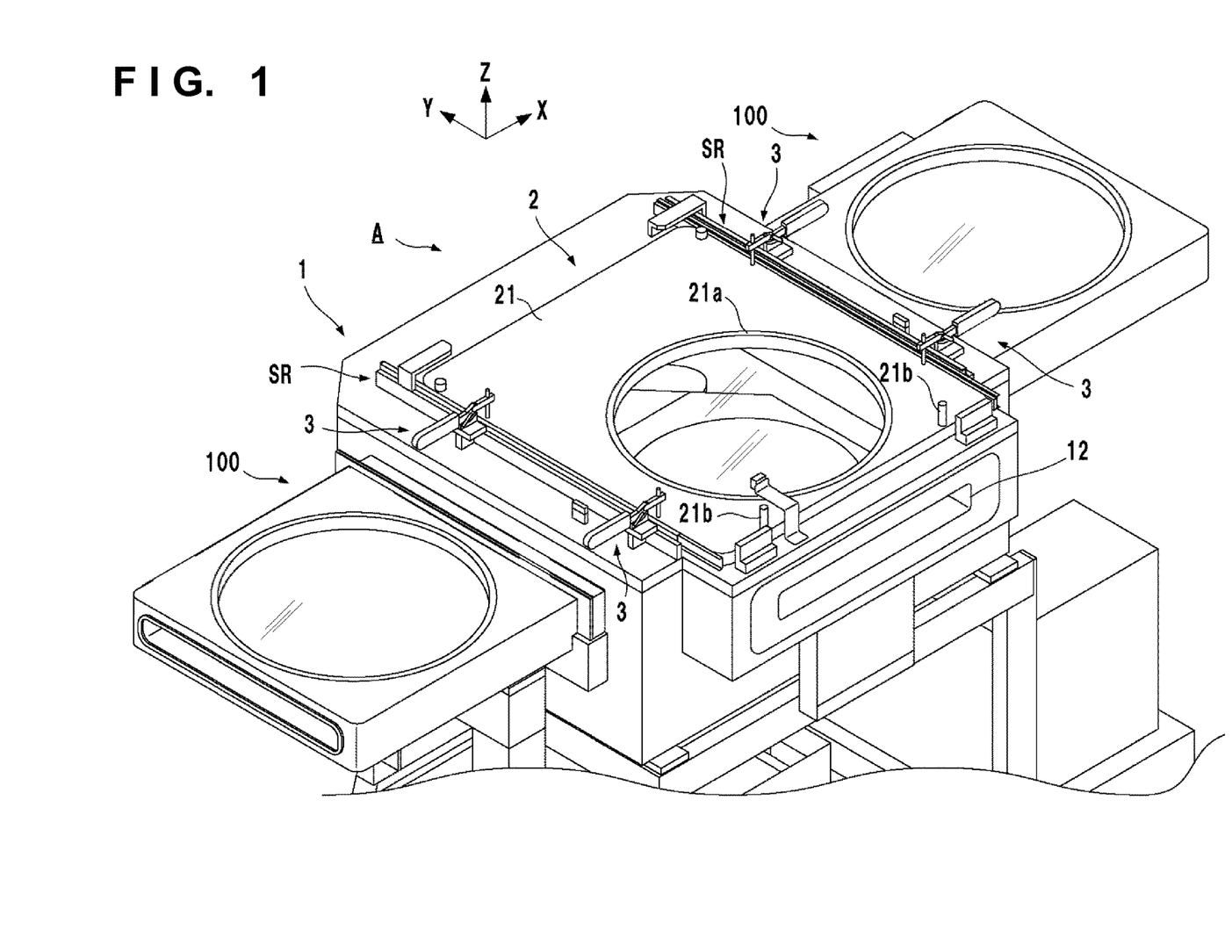
FIG. 1 is a perspective view showing a utilization example of a chamber apparatus according to an embodiment of the present invention.
Figure 2:
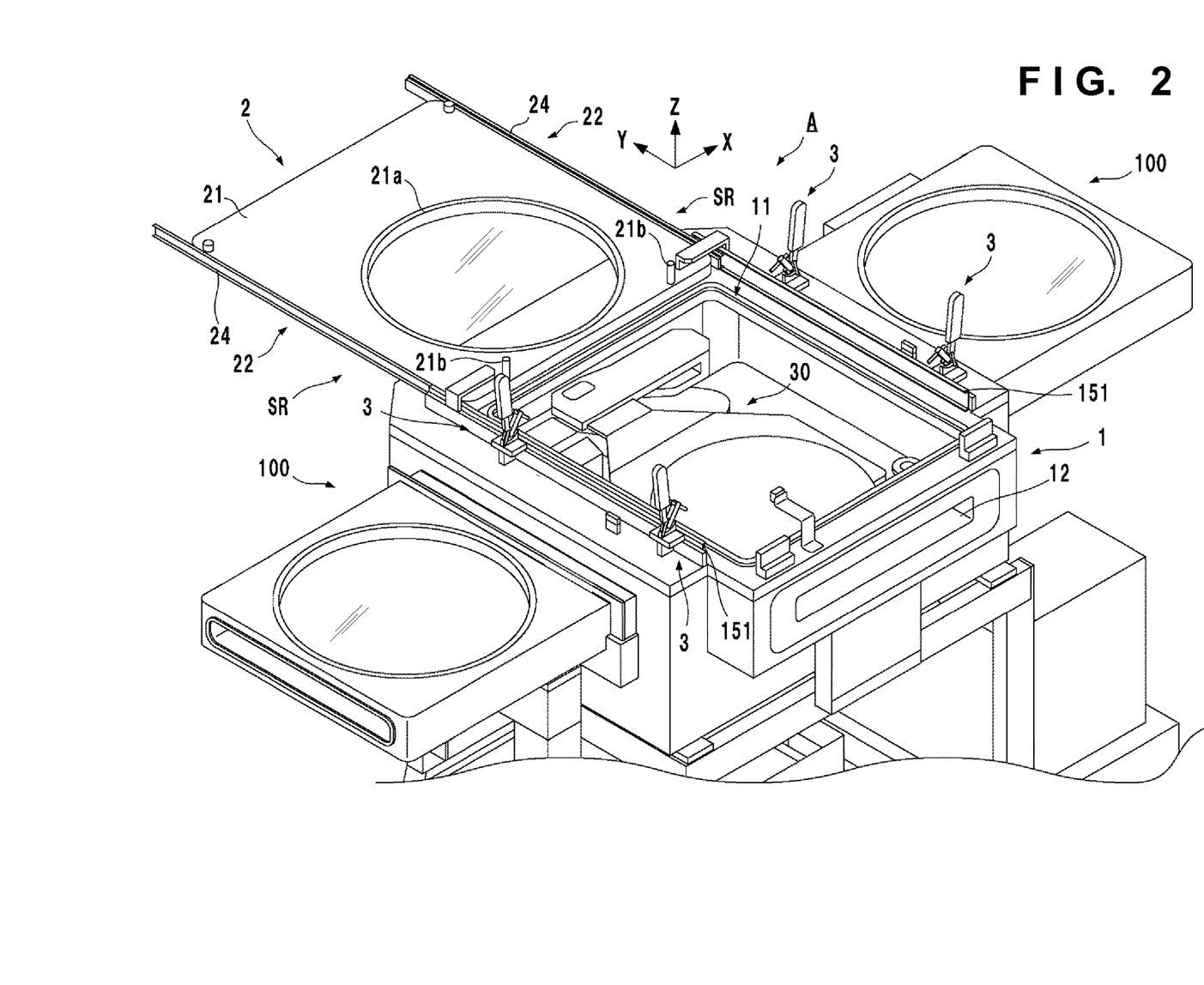
FIG. 2 is a perspective view showing a mode in which the door of the chamber apparatus shown in FIG. 1 is fully opened.

FIGS. 1 and 2 are perspective views showing a utilization example of a chamber apparatus A according to an embodiment of the present invention. FIG. 1 shows a form in which a door 2 is fully closed. FIG. 2 shows a form in which the door 2 is fully opened. The chamber apparatus A according to this embodiment forms the outer wall of a vacuum transport apparatus in which a robot 30 configured to transport a substrate (wafer) is stored. However, the chamber apparatus according to the present invention is applicable to chamber apparatuses of various application purposes. Note that in the drawings, an arrow Z indicates the vertical direction, and arrows X and Y indicate horizontal directions perpendicular to each other.

The chamber apparatus A according to this embodiment includes a chamber main body 1 and the door 2. As shown in FIG. 2, the chamber main body 1 is a box-shaped hollow body with an opening portion 11 formed in the upper surface. The opening portion 11 is opened/closed by the door 2. A vacuum pump (not shown) is connected to the chamber main body 1. The chamber main body 1 has airtightness so as to maintain its internal space in a vacuum state when the door 2 is fully closed.

Load lock chambers 100 are connected to both side portions of the chamber main body 1. Each load lock chamber 100 includes a gate valve. By opening/closing the gate valve, the robot 30 can load/unload a substrate between the chamber apparatus A and the load lock chamber 100. The robot 30 is, for example, a horizontal articulated robot.

An opening portion 12 connected to a process chamber (not shown) is formed in one side portion of the chamber main body 1 in the Y direction. The robot 30 can load/unload a substrate between the chamber apparatus A and the process chamber via the opening portion 12.

The door 2 includes a door main body 21 having a square plate shape, and a support mechanism 22 that supports the door main body 21. Details of the support mechanism 22 will be described later with reference to FIGS. 3, 4A, and 4B.

The door main body 21 includes a portion that covers the opening portion 11, and has, at its center, a window portion 21a closed by, for example, a transparent member. Even when the door 2 is fully closed, the interior of the chamber can visually be recognized through the window portion 21a. Slide rails SR are provided between the door 2 and the chamber main body 1 on both side portions of the door 2 in the X direction. The door 2 can freely slide in the Y direction between the fully closed position shown in FIG. 1 and the fully opened position shown in FIG. 2. The door main body 21 is provided with handles 21b that the operator can grip when opening/closing the door 2.

The chamber main body 1 is provided with a press mechanism 3 that presses the door 2 toward the chamber main body 1 at the fully closed position. In this embodiment, two press mechanisms 3 are arranged along each of both sides of the door 2 in the X direction, that is, a total of four press mechanisms 3 are arranged.

Figure 3:
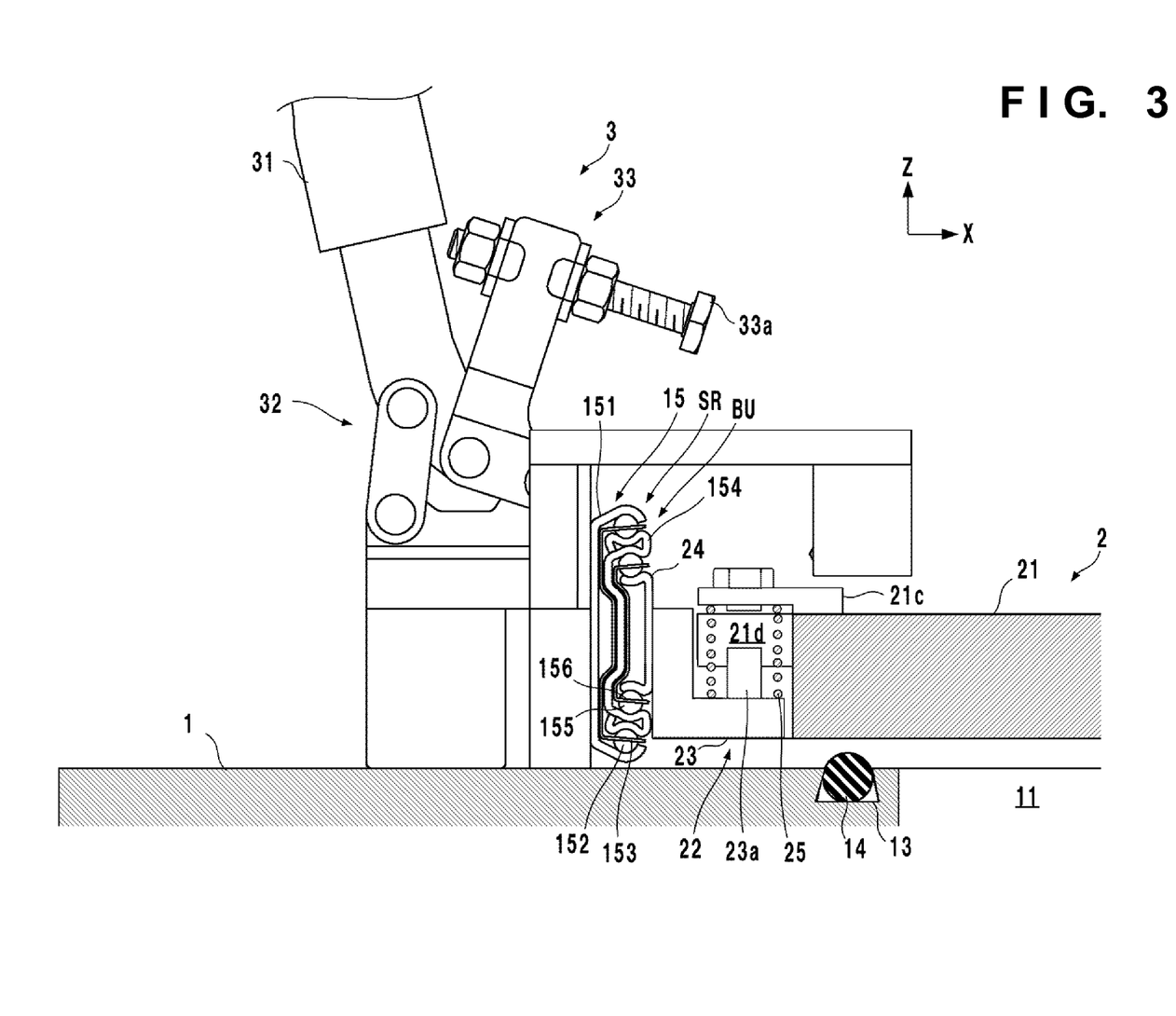
FIG. 3 is an explanatory view showing a slide rail, a support mechanism, and a press mechanism provided in the chamber apparatus shown in FIG. 1.

The arrangements of the slide rail SR, the support mechanism 22, and the press mechanism 3 will be described with reference to FIGS. 3, 4A, and 4B.

In this embodiment, a slide rail that stretches/contracts in two steps will be exemplified as the slide rail SR. The slide rail SR includes a guide rail (outer rail) 151 and a bearing unit BU as components on the side of the chamber main body 1, which form a guide mechanism configured to slidably support the door 2 with respect to the chamber main body 1. In addition, the slide rail SR includes a movable rail (inner rail) 24 as a component on the side of the door 2. The movable rail 24 is a movable member slidably supported by the guide mechanism. Note that the number of slide steps of the slide rail is appropriately selected in accordance with the size and opening degree of the door 2. It may be a slide rail that stretches/contracts in one step or three or more steps.

The guide rail 151 is a rail member fixed to the chamber main body 1. The guide rail 151 has a C-shaped section and extends in the Y direction. The bearing unit BU includes an intermediate rail 154, an outer rolling element 152, a cage 153, an inner rolling element 155, and a cage 156, and slides the movable rail 24 along the extension direction (Y direction) of the guide rail 151.

The intermediate rail 154 is a rail member extending in the Y direction. The intermediate rail 154 has almost the same total length as the guide rail 151 and is arranged inside the guide rail 151. The outer rolling element 152 is a ball bearing. Two lines of outer rolling elements 152 are provided while being spaced apart in the Z direction. The outer rolling elements 152 located in the upper line slide against the upper side of the inner surface of the guide rail 151, and the outer rolling elements 152 located in the lower line slide against the lower side of the inner surface of the guide rail 151. The outer rolling elements 152 of each line are formed from a plurality of rolling element groups arranged in the Y direction. The cage 153 integrally holds the outer rolling elements 152 of each line. The outer rolling elements 152 of each line are arranged between the guide rail 151 and the intermediate rail 154. As the outer rolling elements 152 roll, the intermediate rail 154 can smoothly slide in the Y direction.

The inner rolling element 155 is a ball bearing. Two lines of inner rolling elements 155 are provided inside the inner rolling elements 155 while being spaced apart in the Z direction. The inner rolling elements 155 located in the upper line slide against the upper side of the inner surface of the intermediate rail 154, and the inner rolling elements 155 located in the lower line slide against the lower side of the inner surface of the intermediate rail 154. The inner rolling elements 155 of each line are formed from a plurality of rolling element groups arranged in the Y direction. The cage 156 integrally holds the inner rolling elements 155 of each line. The inner rolling elements 155 of each line are arranged between the intermediate rail 154 and the movable rail 24. As the inner rolling elements 155 roll, the movable rail 24 can smoothly slide in the Y direction.

The support mechanism 22 is a mechanism that is slidably supported by the guide mechanism (the guide rail 151 and the bearing unit BU) and biases the door main body 21 in a direction to separate from the upper surface of the chamber main body 1.

In this embodiment, the support mechanism 22 includes the movable rail 24, a first support 23, an elastic member 25, and a second support 21c. The support 23, the elastic member 25, and the support 21c are provided at each of positions corresponding to the disposing positions of the four press mechanisms 3 based on the fully closed position. Two support mechanisms 22 are arranged along each of both sides of the door main body 21 in the X direction, that is, a total of four support mechanisms 22 are arranged. A notch 21d is formed in the door main body 21 at each of the disposing positions.

The support 23 is an L-shaped member fixed to the movable rail 24. In this embodiment, two supports 23 spaced apart in the Y direction are fixed to the movable rail 24. The two supports 23 and the one movable rail 24 integrally form a member that slides in the Y direction. Each support 23 includes a cylindrical support portion 23a projecting in the Z direction in the notch 21d. The elastic member 25 is attached to the support portion 23a. In this embodiment, the elastic member 25 is a coil spring. The support portion 23a is inserted into the central portion of the elastic member 25. The support portion 23a and the elastic member 25 form a floating mechanism. The floating mechanism connects the support 23 and the support 21c immovably in the horizontal direction, and also supports the support 21c displaceably in the vertical direction with respect to the support 23. Hence, when the movable rail 24 slides in the Y direction, the support 23, the support 21c, and the door main body 21 integrally slide. The elastic member 25 of the floating mechanism always biases the support 21c upward.

The support 21c is fixed to the door main body 21 so as to cover the upper side of the notch 21d, and forms a member that supports the door main body 21 by receiving the biasing force of the elastic member 25. The elastic member 25 intervenes between the support 23 and the support 21c, and always biases, via the support 21c, the door main body 21 in a direction to separate from the upper surface of the chamber main body 1 (upward in the Z direction). In other words, the biasing force of the elastic member 25 is adjusted so as to separate the door main body 21 from the upper surface of the chamber main body 1 via the support 21c. The door main body 21 is thus held in a state in which it is always separated from the upper surface of the chamber main body 1 when the movable rail 24 slides in the Y direction.

With the above-described arrangement of the floating mechanism, the door main body 21 is floating-supported so as to be displaceable in the Z direction with respect to the movable rail 24.

The press mechanism 3 includes a handle 31, a link mechanism 32, and a lever 33. The lever 33 includes a contact member 33a (bolt) that comes into contact with the support 21c. In this embodiment, the press mechanism 3 forms a toggle clamp, and stabilizes in two states, that is, the state shown in FIG. 4A and the state shown in FIG. 4B. As shown in FIGS. 4A and 4B, when each handle 31 pivots downward, the link mechanism 32 makes the lever 33 pivot downward in accordance with the pivotal direction. FIG. 4A shows a retracted state in which the contact member 33a separates from the support 21c. FIG. 4B shows a clamped state in which the contact member 33a comes into contact with the support 21c and presses the door main body 21 toward the chamber main body 1. As shown in FIG. 4B, when the contact member 33a of the press mechanism 3 is brought into contact with the support 21c, the support 21c is pressed toward the support 23 against the upward biasing force of the elastic member 25 in the floating mechanism. In this embodiment, the handle 31 is manually operated to operate the press mechanism 3. Instead, a driving source such as a motor may be provided such that the press mechanism 3 automatically operates.

A groove 13 is formed in the upper surface of the chamber main body 1 so as to surround the opening portion 11. A sealing member (for example, O ring) 14 is held in the groove 13. In the fully closed state of the door 2, if the press mechanism 3 is set in the clamped state, as shown in FIG. 4B, the support 21c is pressed toward the support 23. The door main body 21 thus moves down and crushes the sealing member 14. The sealing member 14 thus seals the contact portion between the door 2 and the chamber main body 1 around the opening portion 11, and the internal space of the chamber apparatus A maintains airtightness.

Figure 4A:
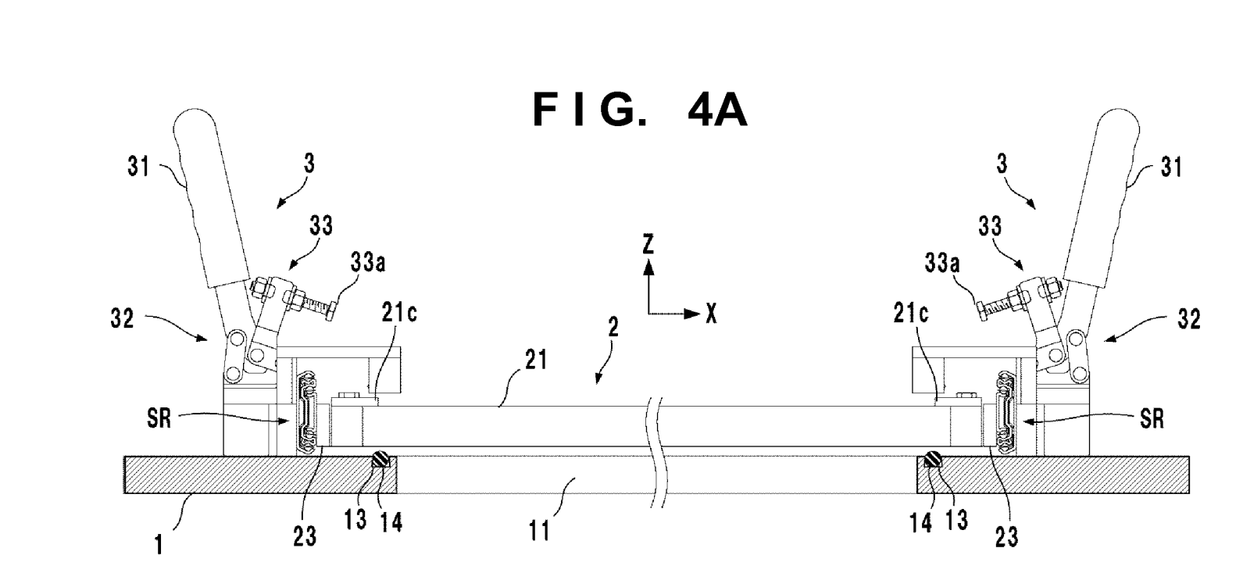
FIG. 4A is an explanatory view showing a form at the time of pressing cancel.
Figure 4B:
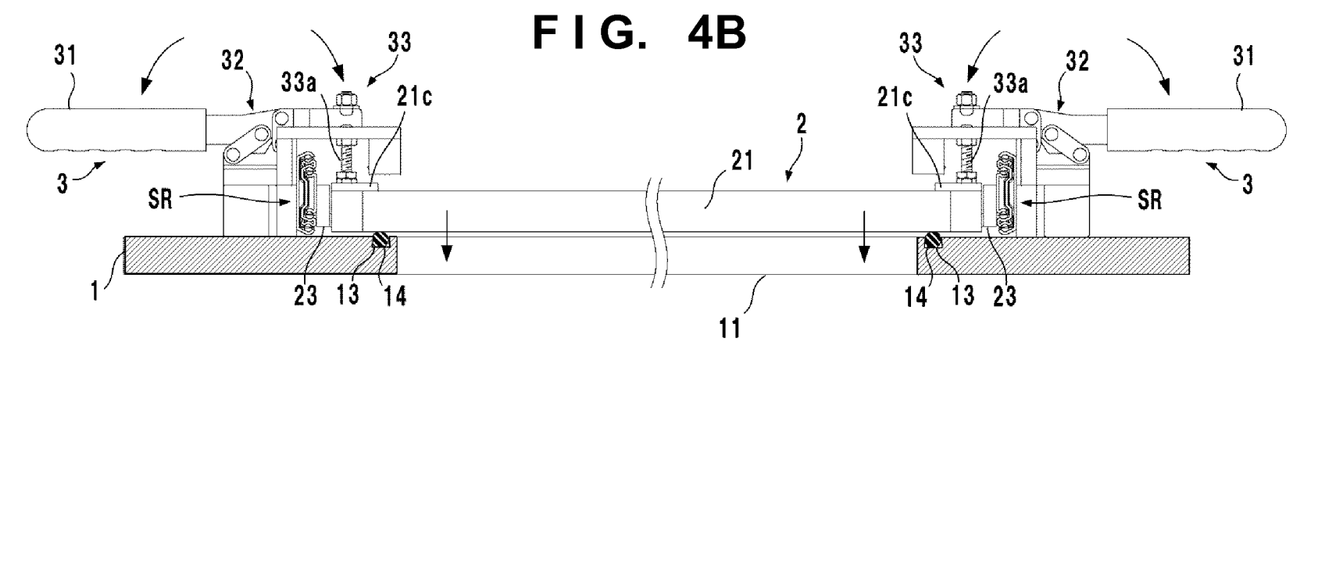
FIG. 4B is an explanatory view showing a form at the time of pressing.

On the other hand, if the press mechanism 3 is set in the retracted state, as shown in FIG. 4A, pressing of the door main body 21 is canceled, and the door main body 21 is raised by the biasing of the elastic member 25. At this time, the door main body 21 is floating-supported. For this reason, since a Z-direction load rarely acts between the intermediate rail 154 and the movable rail 24 of the door 2, the door 2 can smoothly slide between the fully closed position and the fully opened position.

The function of the chamber apparatus A having the above-described arrangement will be described with reference to FIGS. 1 and 2. To attain airtightness in the chamber apparatus A, the door 2 is located at the fully closed position, and the press mechanism 3 is set in the clamped state, as shown in FIG. 1. The sealing member 14 is thus compressed between the chamber main body 1 and the lower surface of the door main body 21, as shown in FIG. 4B, and the door 2 can airtightly close the opening portion 11.

To fully open the door 2, first, the press mechanism 3 is set in the retracted state. The door main body 21 is thus raised by the biasing of the elastic member 25, as shown in FIG. 4A. The operator grips the handles 21b and slides the door 2 in the Y direction, thereby moving the door 2 to the fully opened position, as shown in FIG. 2. Since the opening portion 11 is thus opened, maintenance of the interior of the chamber main body 1 is possible.

As described above, in the chamber apparatus A according to this embodiment, the door 2 slides in the horizontal direction. Hence, the space to open the door is unnecessary above the apparatus. In addition, when sliding the door 2, the door main body 21 is floating-supported in a state in which it is always spaced part from the upper surface of the chamber main body 1, and therefore, the force needed for opening/closing can be very small. Hence, equipment such as a hoisting machine or lifting gear requiring auxiliary power is unnecessary, and the operator can easily open/close the door only by the force of his/her own. It is also possible to maintain the airtightness in the chamber apparatus A by the press mechanism 3 when opening/closing of the door 2.

<Other Embodiments>
<Positioning Mechanism>

A positioning mechanism configured to fix the position of the door 2 at the fully closed position and the fully opened position may be provided. This can prevent the door 2 from inadvertently sliding.

Figure 5A:
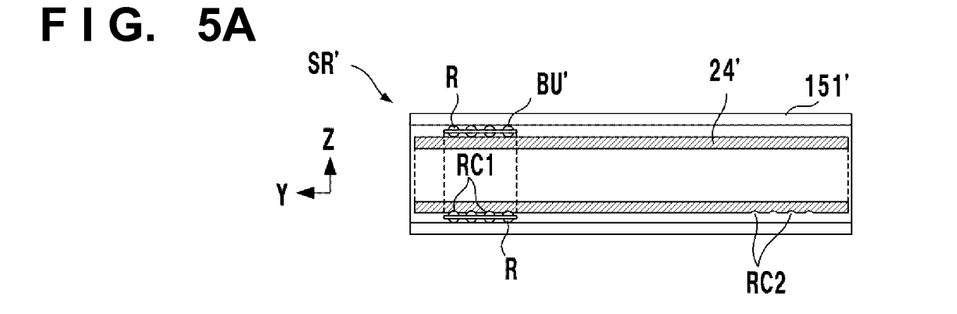
FIGS. 5A to 5D are explanatory views of a positioning mechanism.
Figure 5B:
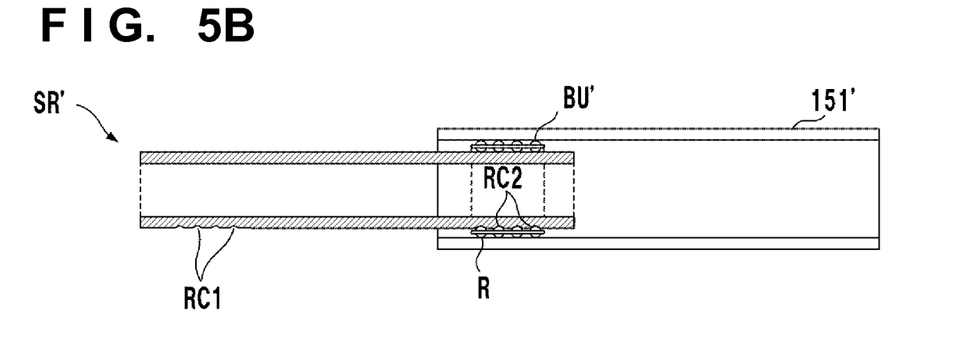

FIGS. 5A and 5B show an example of the positioning mechanism. FIGS. 5A and 5B are schematic views showing an example in which the positioning mechanism is provided on a slide rail SR' replacing the slide rail SR. The slide rail SR' includes a guide rail 151' replacing the guide rail 151, a movable rail 24' replacing the movable rail 24, and a bearing unit BU' replacing the bearing unit BU.

The slide rail SR' stretches/contracts in one step The bearing unit BU' does not include the intermediate rail 154. The bearing unit BU' is formed from rolling elements R and a cage thereof, and fixed at an end of the guide rail 151' in the Y direction.

Concave portions RC1 configured to engage with the rolling elements R are formed in the rolling contact surface on the lower side of one side portion (left side portion in FIG. 5A) of the movable rail 24' in the Y direction. In addition, concave portions RC2 configured to engage with the rolling elements R are formed in the rolling contact surface on the lower side of the other side portion (right side portion in FIG. 5A) of the movable rail 24' in the Y direction. The concave portions RC1 and RC2 are provided in four in accordance with the number of rolling elements R. Each of the concave portions RC1 and RC2 is a spherical concave portion that is so deep as to receive approximately a ¼ to ⅓ portion of the rolling element R.

FIG. 5A shows a form in the fully closed state, and FIG. 5B shows a form in the fully opened state. In the fully closed state shown in FIG. 5A, the rolling elements R engage with the concave portions RC1, and the position of the movable rail 24' (that is, the position of the door 2) is fixed. When the door 2 is slid a little more strongly in the Y direction (leftward direction in FIG. 5A), the rolling elements R move out of the concave portions RC1, and engagement between them, that is, anti-rolling of the rolling elements R is canceled so that the door 2 can slide. When the door 2 reaches the fully opened position, the rolling elements R engage with the concave portions RC2, and the position of the movable rail 24' (that is, the position of the door 2) is fixed, as shown in FIG. 5B. When the door 2 is slid a little more strongly toward the chamber main body 1 in the Y direction (leftward direction in FIG. 5A), the rolling elements R move out of the concave portions RC2, and engagement between them is canceled so that the door 2 can slide.

Figure 5C:
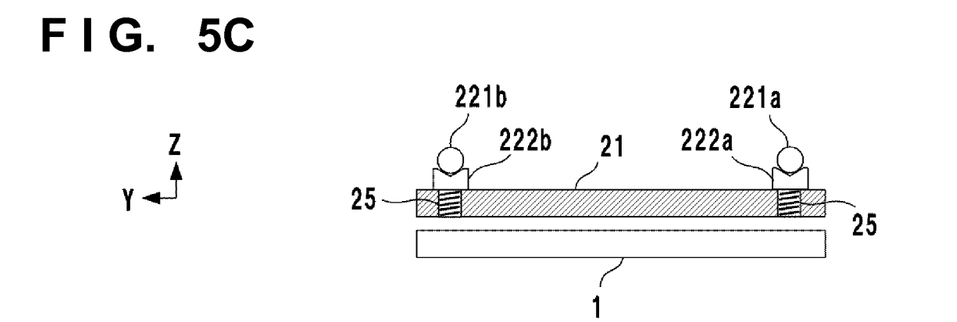
Figure 5D:
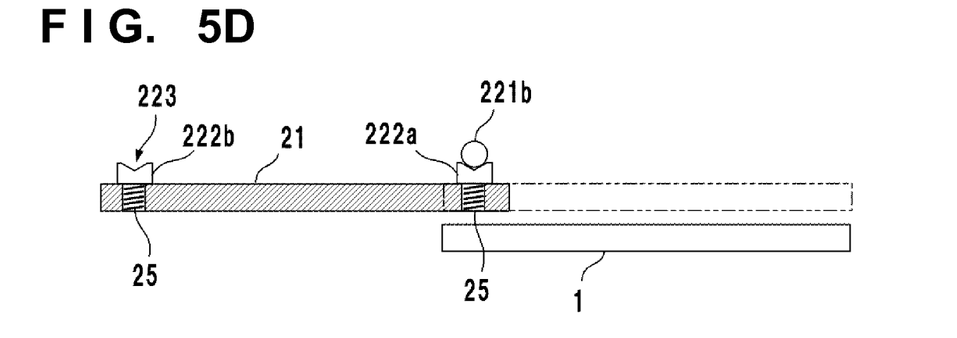

FIGS. 5C and 5D show another example of the positioning mechanism. The elastic member 25 shown in FIG. 3 is provided on the lower surface of the door main body 21. When pressing of the door main body 21 against the chamber main body 1 by the press mechanism 3 is canceled, and clamp is released, the door main body 21 rises from the chamber main body 1 by the elastic force. As shown in FIG. 5D, projecting portions 222a and 222b (to be generically referred to as projecting portions 222) each having an engaging concave portion 223 are provided on the upper surface of the door main body 21. The projecting portions 222 are provided at two points on the upper surface of the door main body 21 (two points on the front and rear sides of the door main body 21 in FIGS. 5C and 5D). Note that bearings 221a and 221b may be formed on the door main body 21, and the projecting portions 222 may be provided on the side of the chamber main body 1. The placement points of the projecting portions 222 and the bearings 221 are not limited to the two points, and they may be provided at three or more points.

FIG. 5C shows a form in the fully closed state, and FIG. 5D shows a form in the fully opened state. In the fully closed state shown in FIG. 5C, when clamping by the press mechanism 3 is canceled, and the door main body 21 rises from the chamber main body 1, the concave portions 223 of the two projecting portions 222a and 222b fit in the bearings 221a and 221b fixed on the side of the chamber main body 1, respectively.

For this reason, even when clamp by the press mechanism 3 is canceled, the door main body 21 never freely slides because its position is fixed. When the door 2 is slid by a predetermined force or more in the Y direction (leftward direction in FIG. 5D), as shown in FIG. 5D, engagement between the concave portions 223 and the bearings 221 is canceled, and the door main body 21 slides. When the door main body 21 reaches the fully opened position, the concave portion 223 of the projecting portion 222a engages with the bearing 221b, and the position of the door main body 21 is fixed. To fully close the door again, when the door main body 21 is slid by a predetermined force or more in the Y direction (leftward direction in FIG. 5D), engagement between the bearing 221b and the concave portion 223 of the projecting portion 222a is canceled so that the door main body 21 can slide.

<Processing Apparatus>

Figure 6A:
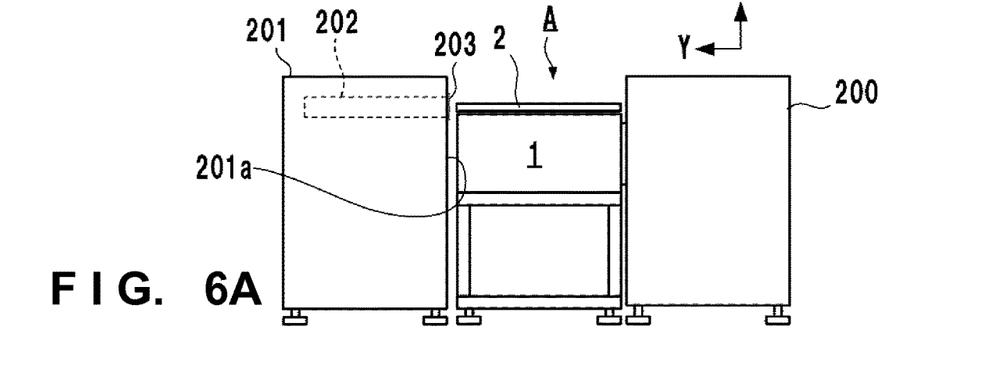
FIGS. 6A to 6C are explanatory views of an example of the arrangement of a processing system.

Out of processing apparatuses (process chamber and the like) for processing a substrate, a processing apparatus adjacent to the chamber apparatus A may be provided with a storage portion for storing the door 2. FIG. 6A is a schematic view of a processing system showing an example.

A process chamber 200 is arranged on one side (right side in FIG. 6A) of the chamber apparatus A in the Y direction, and a process chamber 201 is arranged on the other side (left side in FIG. 6A) in the Y direction. The process chamber 201 is arranged on the slide direction side (direction side to slidably open the door 2) of the door 2 of the chamber apparatus A. In this example, the chamber apparatus A is assumed to load/unload a substrate to/from the process chamber 200 but not to/from the process chamber 201. The process chamber 201 performs substrate loading/unloading with respect to, for example, another vacuum transport apparatus. However, the process chamber 201 may perform substrate loading/unloading with respect to the chamber apparatus A.

Figure 6B:
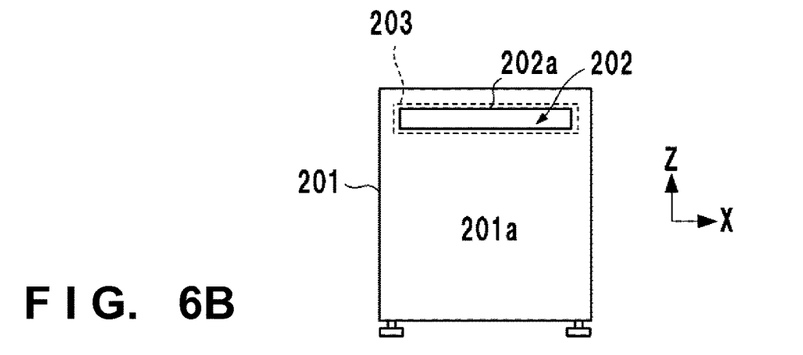

The process chamber 201 has, in its upper portion, a storage space 202 capable of storing the door 2. FIG. 6B is a front view of a surface (to be referred to as a side surface hereinafter) 201a of the process chamber 201 facing the chamber apparatus A. A slot portion 202a is formed in the side surface 201a of the process chamber 201. The slot portion 202a is arranged at a position facing the door 2 and can be opened/closed by a cover 203.

Figure 6C:
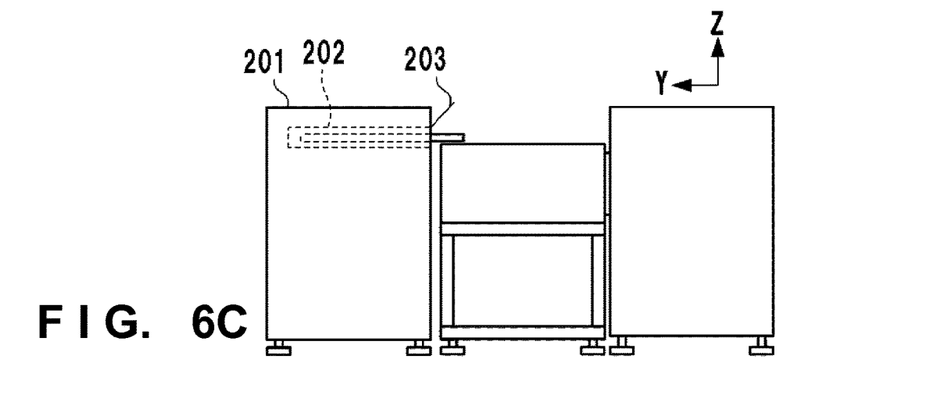

To open the door 2, the cover 203 is opened, as shown in FIG. 6C, and the door 2 is slid in the Y direction. The door 2 is inserted into the storage portion 202 via the slot portion 202a and stored. If the process chamber 201 is configured to store the door 2, as described above, it is unnecessary to arrange the process chamber 201 while leaving the space to open the door 2. In other words, the area (horizontal area almost corresponding to the size of one door 2) to slide the door 2 to open need not be provided. As a result, the degree of freedom in apparatus layout can be improved, and the footprint of the entire apparatus system shown in FIG. 6A can be reduced.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A chamber apparatus comprising:
   a chamber main body including an opening portion in an upper surface;
   a door configured to open/close the opening portion; and
   a guide mechanism configured to horizontally slide said door with respect to said chamber main body,
   wherein said door comprises:
   a movable member slidably supported by said guide mechanism;
   a first support provided on said movable member in a fixed manner;
   a door main body configured to open/close the opening portion;
   a second support provided on said door main body in a fixed manner; and
   a floating mechanism configured to connect said first support and said second support immovably in a horizontal direction and support said second support displaceably in a vertical direction with respect to said first support.

2. The apparatus according to claim 1, wherein said floating mechanism supports said second support while biasing said second support in an upward direction with respect to said first support, and
   the chamber apparatus further comprises a press mechanism configured to press said second support toward said first support against a biasing force of said floating mechanism in the upward direction.

3. The apparatus according to claim 2, wherein said press mechanism comprises a toggle clamp.

4. The apparatus according to claim 1, further comprising a positioning mechanism configured to fix a position of said door at a fully opened position and a fully closed position of said door with respect to the opening portion.

5. The apparatus according to claim 4, wherein said guide mechanism comprises:
   a guide frame fixed to said chamber main body; and
   a bearing unit provided in said guide frame and configured to engage with said movable member and slide said door along an extension direction of said guide frame, and
   said positioning mechanism includes a concave portion engaging with a rolling element in said bearing unit and provided in said movable member.

6. A processing system comprising:
   a chamber apparatus of claim 1; and
   a processing apparatus for processing a substrate,
   wherein said processing apparatus comprises:
   a slot portion arranged on a slide direction side of said door of said chamber apparatus and disposed at a position facing said door in a opened state; and
   a storage portion communicating with said slot portion and configured to store said door.

7. The apparatus according to claim 1, wherein the door at an opened position does not overlap the opening portion in the vertical direction.

8. The apparatus according to claim 1, wherein said door main body covers the whole opening portion when said door positions at a closed position.

9. The apparatus according to claim 1, wherein said floating mechanism includes a coil spring which biases the second support upward.

10. The apparatus according to claim 9, wherein the first support includes a support portion projecting upward, and the coil spring is attached to the support portion.

11. The apparatus according to claim 1, wherein said chamber main body has airtightness so as to maintain its internal space in a vacuum state when said door is fully closed.

12. The apparatus according to claim 1, wherein said guide mechanism includes a guide rail.

13. The apparatus according to claim 1, wherein said guide mechanism and said movable member form a slide rail.

\* \* \* \* \*